(12) United States Patent
Cha (10) Patent No.: US 10,976,775 B1
(45) Date of Patent: Apr. 13, 2021

(54) ROLL-SLIDE MOBILE TERMINAL (71) Applicant: LG ELECTRONICS INC., Seoul (KR)

(72) Inventor: Youngdo Cha, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 0 days.

(21) Appl. No.: 16/811,247

(22) Filed: Mar. 6, 2020

(30) Foreign Application Priority Data

Dec. 19, 2019 (WO) ................ PCT/KR2019/018081

(51) Int. Cl.
*G06F 1/16* (2006.01)
*H05K 7/14* (2006.01)

(52) U.S. Cl.
CPC .......... *G06F 1/1624* (2013.01); *G06F 1/1622* (2013.01); *G06F 1/1652* (2013.01); *H05K 7/1401* (2013.01); *G06F 2200/1612* (2013.01)

(58) Field of Classification Search
CPC combination set(s) only.
See application file for complete search history.

(56) References Cited

U.S. PATENT DOCUMENTS

| | | | | |
|---|---|---|---|---|
| 7,830,333 B2* | 11/2010 | Aoki | ...................... | G06F 1/1616 345/1.3 |
| 7,965,258 B2* | 6/2011 | Aoki | ...................... | G06F 1/1641 345/1.3 |
| 8,379,377 B2* | 2/2013 | Walters | ................ | G06F 1/1652 361/679.04 |
| 8,711,566 B2* | 4/2014 | O'Brien | ................ | G06F 1/1624 361/724 |
| 8,787,008 B2* | 7/2014 | Walters | ................ | G06F 1/1652 361/679.21 |
| 8,860,656 B1* | 10/2014 | Cho | ...................... | G06F 1/3265 345/102 |
| 8,947,344 B2* | 2/2015 | Cho | ...................... | G06F 3/0488 345/102 |
| 9,195,272 B2* | 11/2015 | O'Brien | ................ | G06F 1/1624 |
| 9,424,790 B2* | 8/2016 | Cho | ...................... | G06F 1/1643 |

(Continued)

FOREIGN PATENT DOCUMENTS

JP 2010-143327 A 7/2010
KR 10-2014-0066064 A 5/2014
(Continued)

*Primary Examiner* — Lisa Lea-Edmonds
(74) *Attorney, Agent, or Firm* — Birch, Stewart, Kolasch & Birch, LLP (57) ABSTRACT

A roll-slide mobile terminal including a case including a first frame and a second frame configured to slide and extend in a first direction with respect to the first frame, a flexible display wound over a front surface and a rear surface of the case, wherein an area of the front surface of the flexible display is increased or decreased in size based on a sliding movement of the second frame, a slide assembly provided in one member of the first frame and the second frame and including a shaft having a rotation axis in the first direction and forming a screw line along the rotation axis, wherein the second frame slidably moves with respect to the first frame according to a rotation of the shaft, and a screw hole provided in the other member of the first frame and the second frame, the screw hole configured to engage the screw line of the shaft passing through the screw hole.

20 Claims, 8 Drawing Sheets

(56) References Cited

U.S. PATENT DOCUMENTS

| | | | |
|---|---|---|---|
| 9,829,925 B2* | 11/2017 | Lim | G06F 1/1652 |
| 10,152,086 B2* | 12/2018 | Choi | G06F 1/1652 |
| 10,424,272 B2* | 9/2019 | Yoon | G06F 3/04817 |
| 10,613,655 B2* | 4/2020 | Yoon | G06F 3/0488 |
| 10,627,931 B2* | 4/2020 | Chung | G06F 1/1652 |
| 10,742,784 B1* | 8/2020 | Jo | H04M 1/0239 |
| 2006/0192726 A1* | 8/2006 | Huitema | G06F 1/169 345/1.1 |
| 2012/0212433 A1* | 8/2012 | Lee | G06F 3/041 345/173 |
| 2013/0058063 A1 | 3/2013 | O'Brien | |
| 2014/0218375 A1* | 8/2014 | Kim | G06F 3/0488 345/501 |
| 2014/0247544 A1* | 9/2014 | Ryu | H05K 5/0226 361/679.01 |
| 2017/0140504 A1* | 5/2017 | Jeong | G06T 3/40 |
| 2018/0088695 A1* | 3/2018 | Kim | G06F 1/1643 |
| 2018/0181164 A1* | 6/2018 | Chen | G06F 1/1652 |
| 2019/0042014 A1* | 2/2019 | Ohata | G06F 3/0481 |
| 2019/0227599 A1* | 7/2019 | Kwak | G06F 3/14 |
| 2019/0261519 A1* | 8/2019 | Park | H04N 9/3188 |
| 2019/0305237 A1* | 10/2019 | Shin | H01L 51/524 |
| 2019/0346954 A1* | 11/2019 | Jung | G06F 3/0481 |
| 2019/0369670 A1* | 12/2019 | Cho | G06F 1/1652 |
| 2019/0384438 A1* | 12/2019 | Park | G06F 1/1652 |
| 2020/0033913 A1* | 1/2020 | Yang | G06F 1/1624 |
| 2020/0192434 A1* | 6/2020 | Huang | H04M 1/0268 |
| 2020/0212326 A1* | 7/2020 | Eom | H01L 51/5237 |
| 2020/0253069 A1* | 8/2020 | Cha | G09F 9/301 |
| 2020/0264660 A1* | 8/2020 | Song | G06F 1/1686 |
| 2020/0267246 A1* | 8/2020 | Song | H04M 1/0268 |
| 2020/0267247 A1* | 8/2020 | Song | H04M 1/0237 |
| 2020/0304613 A1* | 9/2020 | Cha | H04M 1/0237 |

FOREIGN PATENT DOCUMENTS

| | | |
|---|---|---|
| KR | 10-2016-0141255 A | 12/2016 |
| KR | 10-2017-0123382 A | 11/2017 |

* cited by examiner

ROLL-SLIDE MOBILE TERMINAL

CROSS-REFERENCE TO RELATED APPLICATION

Pursuant to 35 U.S.C. § 119, this application claims the benefit of priority to PCT International Application No. PCT/KR2019/018081 filed on Dec. 19, 2019, the contents of which are all hereby incorporated by reference herein in its entirety.

BACKGROUND OF THE INVENTION

Field of the Invention

This disclosure relates to a roll-slide mobile terminal having a flexible display on which a screen is expandable in size.

Discussion of the Related Art

A display device is a device having a function of receiving, processing, and displaying an image to be viewed by a user. For example, the display device receives a signal of broadcast selected by a user among broadcast signals transmitted from a broadcast station, separates a video signal from the received signal, and displays the separated image signal on a display.

Recently, with developments in broadcasting technology and network technology, functions of the display device have been diversified, and the performance of the display device has been improved accordingly. That is, the display device has been developed to provide not only simply broadcast content but also other various content to users. For example, the display device may provide game playing, music listening, online shopping, user-customized information, and the like by using various applications as well as programs received from the broadcasting station. To perform such an extended function, the display device is connected to various devices or networks using various communication protocols basically, thereby providing a ubiquitous computing environment to the user. In other words, the display device has been evolved into a smart device that realizes the ubiquitous computing and connectivity to the network.

Also, advances in network technologies and expansions of infrastructures have enabled the display device and the smart device to perform various and professional tasks. Accordingly, there has been an increasing desire for a display device with a large screen. However, in general, when a screen size increases, a size of a device correspondingly increases.

To solve this, a flexible display can be applied to an expandable mobile terminal such that the flexible display is extended along with the mobile terminal. For example, the flexible display may be provided over a front surface and a rear surface of the expandable mobile terminal so that a front surface part of the flexible display is expanded according to the expansion of the mobile terminal. The mobile terminal is defined as a roll-slide mobile terminal.

As an example of an expansion mechanism of the roll-slide mobile terminal, a structure in which a motor transmits a driving force to a linear shaft may be used. However, in the motor and linear shaft structure, since gears of the motor and the linear shaft come into direct contact with each other, a high operating force is required and an excessive load is generated on the connected gears.

Accordingly, the expansion mechanism of the roll-slide mobile terminal may be considered in other ways. Also, when extending the roll-slide mobile terminal using the motor, the roll-slide mobile terminal may extend further than a designed length due to inaccuracy of motor driving, driving inertia, and cumulative tolerance in manufacturing, which may cause an unexpected problem.

SUMMARY OF THE INVENTION

An aspect is to solve a problem that an excessive load is applied to a motor and a shaft.

Another aspect is to solve a problem occurring due to an excessive expansion of a mobile terminal.

Another aspect is to solve a problem that a motor is unable to be restored to an original state once disengaged and deviated from a gear for expansion of a mobile terminal.

Another aspect is to solve an inefficiency of conventional power usage by extending a mobile terminal using a relatively small force.

According to an aspect, there is provided a roll-slide mobile terminal including a case including a first frame and a second frame configured to slide and extend in a first direction with respect to the first frame, a flexible display wound over a front surface and a rear surface of the case, wherein an area of the front surface of the flexible display is increased or decreased in size based on a sliding movement of the second frame, a slide assembly provided in one member of the first frame and the second frame and including a shaft having a rotation axis in the first direction and forming a screw line along the rotation axis, wherein the second frame slidably moves with respect to the first frame according to a rotation of the shaft, and a screw hole provided in the other member of the first frame and the second frame, the screw hole configured to engage the screw line of the shaft passing through the screw hole.

BRIEF DESCRIPTION OF THE DRAWINGS

The above and other aspects, features, and advantages of certain embodiments will be more apparent from the following detailed description taken in conjunction with the accompanying drawings, in which:

FIGS. 2A through 3B illustrate front perspective views and rear views obtained before and after a display part of a roll-slide mobile terminal is expanded according to an example embodiment of the present disclosure;

DETAILED DESCRIPTION OF THE EMBODIMENTS

Hereinafter, preferred embodiments of the present disclosure will be described in detail with reference to the accompanying drawings, and the same or similar elements are designated with the same numeral references regardless of the numerals in the drawings and their redundant description will be omitted. A suffix "module" or "unit" used for constituent elements disclosed in the following description is merely intended for easy description of the specification, and the suffix itself does not give any special meaning or function. Also, it should be noted that the accompanying drawings are merely illustrated to easily explain the concept of the invention, and therefore, they should not be construed to limit the technological concept disclosed herein by the accompanying drawings.

The terms 'first', 'second', etc. may be used to describe various components, but the components are not limited by such terms. The terms are used only for the purpose of distinguishing one component from other components. When an arbitrary component is described as "being connected to" or "being linked to" another component, this should be understood to mean that still another component(s) may exist between them, although the arbitrary component may be directly connected to, or linked to, the corresponding other component. In contrast, when an arbitrary component is described as "being directly connected to" or "being directly linked to" another component, this should be understood to mean that no component exists between them.

A singular expression can include a plural expression as long as it does not have an apparently different meaning in context. In the present application, the terms "include" and "have" should be understood to be intended to designate that illustrated features, numbers, steps, operations, components, parts or combinations thereof exist and not to preclude the existence of one or more different features, numbers, steps, operations, components, parts or combinations thereof, or the possibility of the addition thereof.

Figure 1:
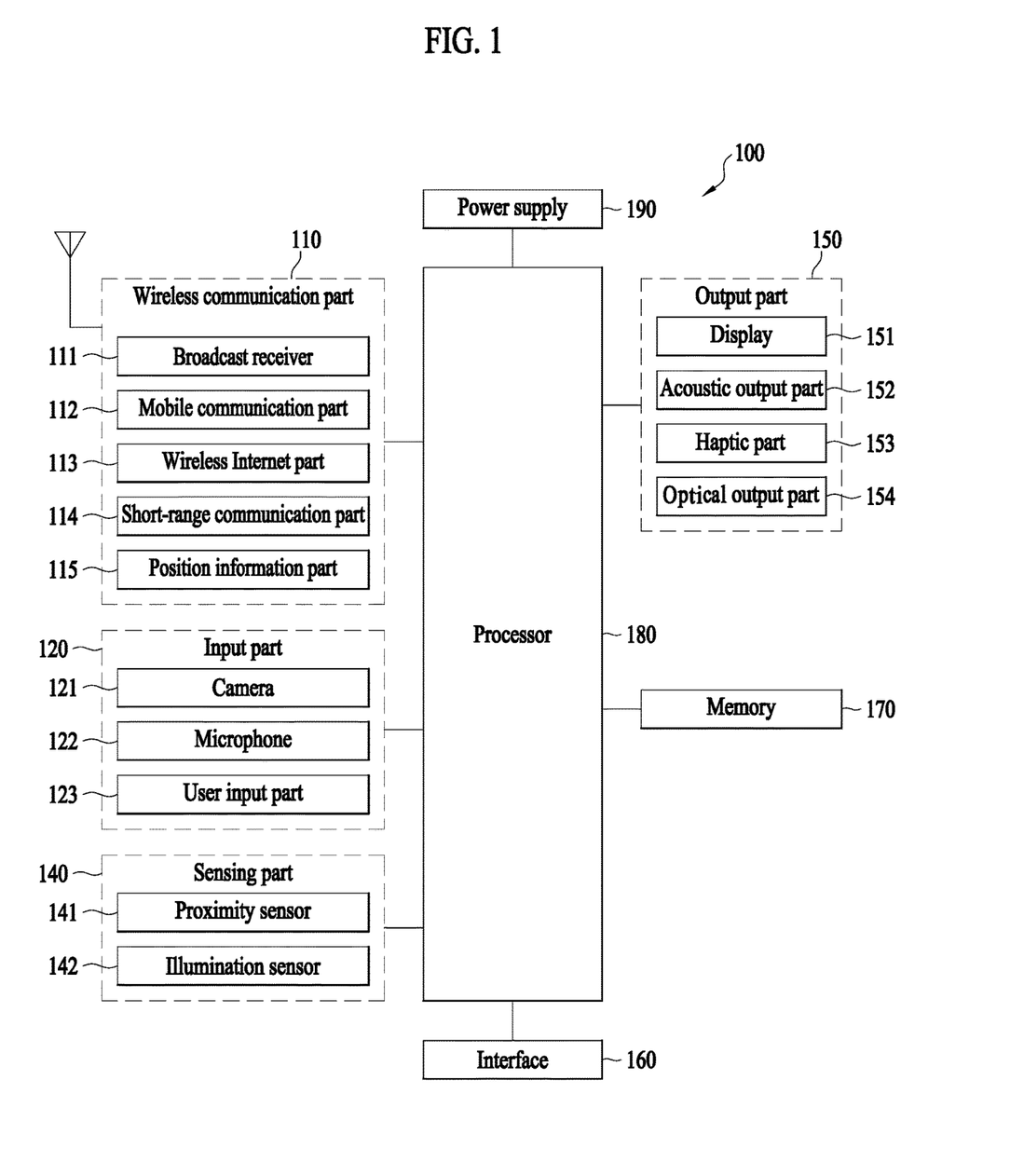
FIG. 1 is a block diagram illustrating a roll-slide mobile terminal according to the present disclosure.

FIG. 1 is a block diagram illustrating a roll-slide mobile terminal 100 related to an example embodiment of the present disclosure. It is assumed that the mobile terminal of the present invention is the roll-slide mobile terminal 100. Therefore, the mobile terminal to be described later refers to the roll-slide mobile terminal 100.

A mobile terminal 100 may include a wireless communication part 110, an input part 120, a sensing part 140, an output part 150, an interface 160, a memory 170, a processor 180, and a power supply 190. The components illustrated in FIG. 1 are not essential to implementing the mobile terminal, so the mobile terminal 100 described herein may have more or fewer components than those listed above.

Specifically, the wireless communication part 110 may include at least one module that enables wireless communication to be performed between the mobile terminal 100 and a wireless communication system, between the mobile terminal 100 and another mobile terminal 100, or between the mobile terminal 100 and an external server. The wireless communication part 110 may include one or more modules that connect the mobile terminal 100 to one or more networks.

The wireless communication part 110 may include at least one of a broadcast receiver 111, a mobile communication part 112, a wireless Internet part 113, a short-range communication part 114, and a position information part 115. Referring to the wireless communication part 110, the broadcast receiver 111 of the wireless communication part 110 may receive a broadcast signal and/or broadcast related information from an external broadcast management server through a broadcast channel. The broadcast channel may include a satellite channel and a terrestrial channel. Two or more broadcast receiving modules may be provided to the mobile terminal 100 for simultaneous broadcast reception or broadcast channel switching for at least two broadcast channels.

The mobile communication part 112 can transmit and receive a wireless signal to and from at least one of a base station, an external terminal, and a server on a mobile communication network constructed based on technical standards for mobile communication or communication schemes such as Global System for Mobile communication (GSM), Code Division Multi Access (CDMA), Code Division Multi Access 2000 (CDMA2000), Enhanced Voice-Data Optimized or Enhanced Voice-Data Only (EV-DO), Wideband CDMA (WCDMA), High Speed Downlink Packet Access (HSDPA), High Speed Uplink Packet Access (HSUPA), Long Term Evolution (LTE), Long Term Evolution-Advanced (LTE-A), and the like, for example. The wireless signal may include various types of data based on transmission and reception of a voice call signal, a video call signal, or a text/multimedia message.

The wireless Internet part 113 refers to a module for wireless Internet access, and can be embedded or disposed external to the mobile terminal 100. The wireless Internet part 113 can transmit or receive the wireless signal in the communication network based on wireless Internet technologies.

The wireless Internet technologies may be, for example, Wireless LAN (WLAN), Wireless-Fidelity (Wi-Fi), Wi-Fi Direct, Digital Living Network Alliance (DLNA), Wireless Broadband (WiBro), World Interoperability for Microwave Access (WiMAX), High Speed Downlink Packet Access (HSDPA), High Speed Uplink Packet Access (HSUPA), Long Term Evolution (LTE), and Long Term Evolution-Advanced (LTE-A). The wireless Internet part 113 can transmit and receive data based on at least one wireless Internet technology in a range including Internet technologies not listed above.

In view of that the wireless Internet access made by WiBro, HSDPA, HSUPA, GSM, CDMA, WCDMA, LTE, and LTE-A is based on a mobile communication network, the wireless Internet part 113 that performs the wireless Internet access through the mobile communication network may be understood as a kind of the mobile communication part 112.

The short-range communication part 114 is for short-range communication, and supports the short-range communication using at least one of Bluetooth™, Radio Frequency Identification (RFID), Infrared Data Association (IrDA), Ultra Wideband (UWB), ZigBee, NFC (Near Field Communication), Wi-Fi(Wireless-Fidelity), Wi-Fi Direct, Wireless Universal Serial Bus (USB) technology. The short-range communication part 114 may use wireless area networks to support wireless communication between the mobile terminal 100 and a wireless communication system, wireless communication between the mobile terminal 100 and another mobile terminal 100, or wireless communication between the mobile terminal 100 and a network in which another mobile terminal (100 or external server). The wireless range networks may be wireless personal area networks.

The position information part 115 may be a module that acquires a position (or current position) of a mobile terminal. A representative example of the position information part 115 may be a global positioning system (GPS) mobile or a Wi-Fi module. The mobile terminal can use the GPS module to acquire a position of the mobile terminal using signals transmitted from a GPS satellite. The mobile terminal can use the Wi-Fi module to acquire a position of the mobile terminal based on information on a wireless access point (AP) that transmits or receives a wireless signal to or from the Wi-Fi module. As necessary, the position information part 115 can perform a certain function of other modules of the wireless communication part 110 to acquire data on the position of the mobile terminal, additionally or in substitution. The position information part 115 may be a module used to acquire a position (or current position) of the mobile terminal and is not limited as a module that directly calculates or acquires a position of the mobile terminal.

The input part 120 may include a camera 121 or an image input part to receive an image signal input, a microphone 122 or an audio input part to receive an audio signal input, or a user input part 123, for example, a touch key and a mechanical key to receive information from a user. Voice data or image data collected by the input part 120 can be analyzed and processed as a control command of the user.

The camera 121 can process an image frame such as a stationary image or a moving image acquired by an image sensor in a video call mode or a capturing mode. The processed image frame can be displayed on the display 151 or stored in the memory 170. For example, the mobile terminal 100 may include a plurality of cameras 121. In this example, the cameras 121 can be arranged in a matrix structure. Through the cameras 121 arranged in the matrix structure, a plurality of pieces of image information having various angles and focal points can be input to the mobile terminal 100. Also, the plurality of cameras 121 can be arranged in a stereo structure to acquire left and right images for implementing a stereo image.

The microphone 122 can process an external acoustic signal into electrical voice data. The processed voice data may be variously used based on a function performed (or an application program executed) in the mobile terminal 100. In the microphone 122, various noise removal algorithms can be implemented to remove noise generated in a process of receiving external acoustic signals.

The user input part 123 can receive information from a user. When the information is input through the user input part 123, the processor 180 can control an operation of the mobile terminal 100 based on the input information. The user input part 123 may include a mechanical input mechanism (or a mechanical key, for example, a button a dome switch, a jog wheel, and a jog switch on a front, rear, or side surface of the mobile terminal 100) and a touch input means. The touch input mechanism may include a virtual key, a soft key, or a visual key displayed on a touch screen through a software process, or include a touch key in a portion other than the touch screen. The virtual key or the visual key can each be displayed in a variety of forms and be any one or in a combination of, for example, graphics, texts, icons, and videos.

The sensing part 140 may include one or more sensors to sense at least one of information in the mobile terminal, surrounding environment information of the mobile terminal, or user information. For example, the sensing part 140 may include at least one of a proximity sensor 141, an illumination sensor 142, a touch sensor, an acceleration sensor, a magnetic sensor, a gravity (G)-sensor, a gyroscope sensor, a motion sensor, an RGB sensor, an infrared (IR) sensor, an ultrasonic sensor, a finger scan sensor, an optical sensor, for example, a camera (refer to the camera 121), a microphone (refer to the microphone 122), a battery gauge, an environment sensor (for example, a barometer, a hygrometer, a thermometer, a radioactivity sensor, a heat sensor, and a gas detection sensor), and a chemical sensor (for example, an electronic nose, a healthcare sensor, and a biometric sensor). In the present disclosure, the mobile terminal can use a combination of pieces of information sensed in at least two sensors among the aforementioned sensors.

The output part 150 can generate a visual, auditory, or tactile output. The output part 150 may include at least one of the display 151, an acoustic output part 152, a haptic part 153, and an optical output part 154. The display 151 may form a layer structure or an integrated structure with a touch sensor to implement a touch screen. The touch screen can function as the user input part 123 that provides an input interface between the mobile terminal 100 and a user and simultaneously, provide an output interface between the mobile terminal 100 and the user.

The acoustic output part 152 can output audio data stored in the memory 170 or received from the wireless communication part 110 in, for example, a call signal reception, a call mode or a recording mode, a voice recognition mode, and a broadcast reception mode. The acoustic output part 152 can output an acoustic signal related to a function (for example, a call signal reception sound and a message reception sound) performed in the mobile terminal 100. For example, the acoustic output part 152 may include at least one of a receiver, a speaker, or a buzzer.

The haptic part 153 can generate various tactile effects to be experienced by a user. A vibration is a representative example of the tactile effects generated by the haptic part 153. An intensity and a pattern of the vibration generated by the haptic part 153 can be determined based on a selection of a user or setting of the processor 180. For example, the haptic part 153 can output a combination of different vibrations or output different vibrations in sequence.

The optical output part 154 can output a signal to announce an event occurrence using light of a light source of the mobile terminal 100. An event occurring in the mobile terminal 100 may be, for example, message reception, a call signal reception, missed call, alarm, schedule notification, e-mail reception, and application-based information reception.

The interface 160 functions as a passage to various types of external devices connected to the mobile terminal 100. For example, the interface 160 may include at least one of a wired/wireless headset port, an external charger port, a wired/wireless data port, a memory card port, a port connecting a device equipped with an identification module, an audio input/output (I/O) port, a video I/O port, and an earphone port. In response to the interface 160 being connected to an external device, the mobile terminal 100 can perform an appropriate control associated with the connected external device.

The memory 170 can store data supporting various functions of the mobile terminal 100, and store application programs (or applications) run in the mobile terminal 100, data for operation of the mobile terminal 100, and instructions. At least a portion of the application programs can be downloaded from an external server through wireless communication. Also, at least a portion of the application programs can exist in the mobile terminal 100 for a basic function (for example, call forwarding and outgoing function and message receiving and outgoing function) of the mobile terminal 100 from the time of manufacture. The application program can be stored in the memory 170, installed in the mobile terminal 100, and run by the processor 180 to perform an operation (or function) of the mobile terminal.

The processor 180 generally controls an overall operation of the mobile terminal 100 in addition to operations related to the application programs. The processor 180 can process a signal, data, information, and the like input or output through the aforementioned components or run the application program stored in the memory 170, thereby providing information to a user or performing appropriate information or function.

Also, to run the application program stored in the memory 170, the processor 180 can control at least a portion of the components shown in FIG. 1. Furthermore, to run the application program, the processor 180 can operate a combination of two or more components among the components included in the mobile terminal 100.

The power supply 190 supplies power to each component included in the mobile terminal 100 by receiving external or internal power under a control of the processor 180. The power supply 190 may include a battery. The battery may include a built-in battery or a removable battery. At least a portion of the aforementioned components can operate in cooperation with each other to implement an operation, a control, or a control method of the mobile terminal according to various embodiments as described below. Also, the operation, control, or control method of the mobile terminal may be implemented on the mobile terminal through an execution of at least one application program stored in the memory 170.

A roll-slide mobile terminal of the present disclosure, for example, the mobile terminal 100 may be in a bar shape. In particular, the roll-slide mobile terminal 100 may be long in a longitudinal direction in a retracted state and have a shape close to a square in an expanded state. However, this is merely an example and the roll-slide mobile terminal 100 may have various shapes within the scope of not contradicting features of the present disclosure.

In the present disclosure, the roll-slide mobile terminal 100 refers to a mobile terminal obtained by applying a flexible display to the above-described mobile terminal. The flexible display refers to a lightweight and durable display manufactured on a thin and flexible substrate so as to be curved, bendable, folded, twisted, or rolled like a paper while having a characteristic of a typical flat panel display. The flexible display can be bendable and in particular, a bendable area can be variable.

The flexible display may implement a flexible touch screen in combination with a touch sensor. In response to a touch being input through the flexible touch screen, the processor may perform a control corresponding to the touch input.

The touch sensor can sense a touch (or touch input) applied to the touch screen based on at least one of various touch types including a resistive type, a capacitive type, an infrared type, an ultrasonic type, and a magnetic field type. As an example, the touch sensor can be configured to convert a change such as a pressure applied to a predetermined portion of the touch screen or a capacitance generated at the predetermined portion into an electrical input signal. In addition, the touch sensor can detect a position at which a touch object applying a touch on the touch screen is touched on the touch sensor, an area, a touch pressure, a touch capacitance, and the like.

Further, the roll-slide mobile terminal 100 can include a deformation detection mechanism that detects a deformation of the flexible display. For example, the deformation detection mechanism may be included in the sensing part.

Information related to the deformation may include, for example, a direction in which the flexible display is deformed, a degree of deformation, a deformed position, a deformation time, and an acceleration at which the deformed flexible display is restored. In addition, the information related to the deformation may be various information to be detected in response to the flexible display being bent.

Also, based on the information related to the deformation of the flexible display detected by the deformation detection mechanism, the processor 180 can change information displayed on the flexible display or generate a control signal for controlling functions of the roll-slide mobile terminal 100. A state change of the flexible display, for example, an expansion or reduction of a front surface area can occur due to an external force but not be limited thereto. For example, the front surface area of the flexible display can be expanded or reduced by the user or based on a command of an application. A driving part may be included to change the state of the flexible display without applying the external force.

When the flexible display covers from the front surface to a rear surface, a space implemented in a typical rear case to mount an antenna may be restricted. Thus, the antenna may be embodied on the flexible display. For example, an antenna on display (AOD) may be in a form of a transparent film in which an electrode layer including a pattern and a dielectric layer are laminated. The AOD can be implemented to be thinner than a laser direct structuring (LDS) antenna implemented through copper nickel plating, have a low thickness dependency, and be invisible on appearance.

Further, the display part 151 can be implemented as the flexible display. In particular, the flexible display 151 refers to a plurality of panel sets that directly perform an output function, including the flexible display. For example, the flexible display 151 may include the flexible display and the touch screen. The above-described properties of the deformable flexible display may be equally applied to the flexible display 151. The display 151 mentioned below is assumed to be the flexible display 151 unless otherwise stated.

Figure 2A:
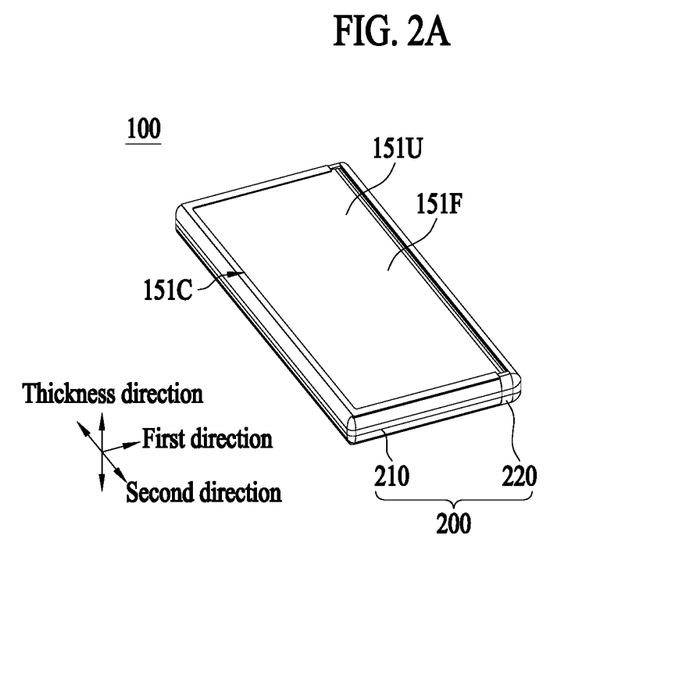
Figure 2B:
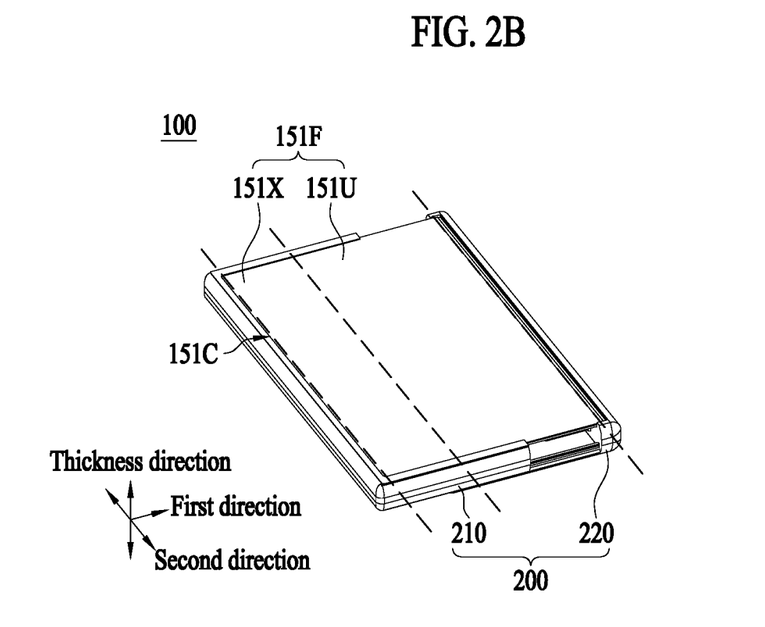
Figure 3A:
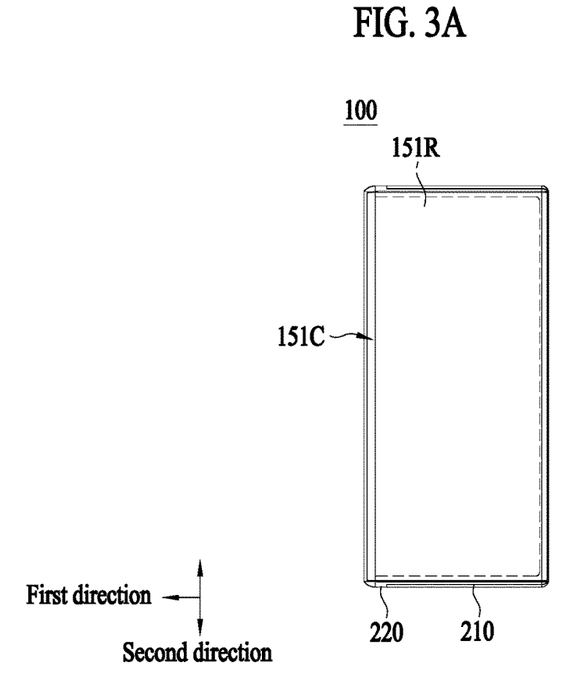
Figure 3B:
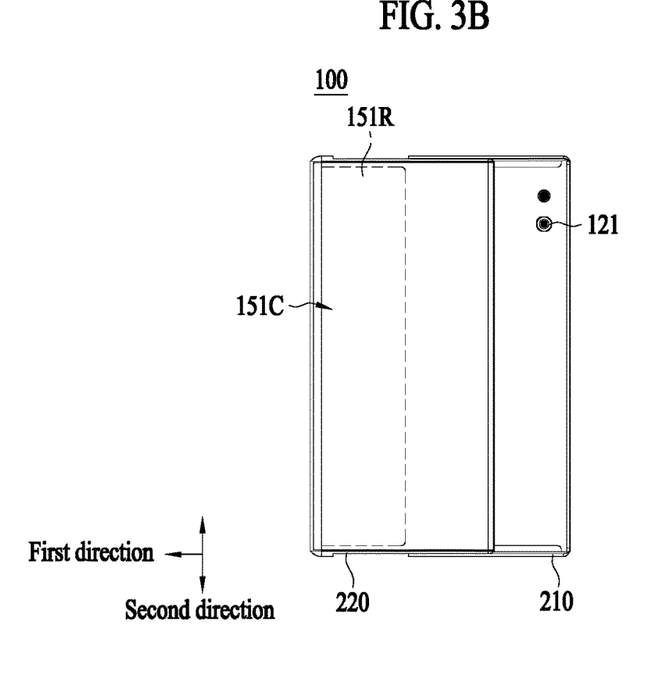

Next, FIGS. 2A and 2B illustrate front perspective views obtained before and after an expansion of the display 151 of the roll-slide mobile terminal 100, and FIGS. 3A and 3B illustrate rear views obtained before and after an expansion of the display 151 of the roll-slide mobile terminal 100 according to embodiments of the present disclosure.

As shown, the display 151 has one side fixed at a front surface area based on the roll-slide mobile terminal 100, and is wound at an edge of one end of the roll-slide mobile terminal 100 so as to be provided over a rear surface. The area of the display 151 comprises a front surface area 151F, a rear surface area 151R and a winding area 151C. The winding area 151C divides the area of the display 151 into the front surface area 151F and the rear surface area 151R. The winding area 151C represent a curved area corresponding to the edge of one end of the roll-slide mobile terminal 100.

A front surface area 151F of the display 151 can be expandable. When the front surface area 151F of the display 151 increases, a rear surface area 151R of the display 151 can be reduced. Conversely, when the front surface area 151F of the display 151 is reduced, the rear surface area 151R of the display 151 increases. The winding area 151C moves based on the variety of the front surface area 151F or the rear surface area 151R.

To guide and support the expanded and retracted display 151, a case 200 supporting the display 151 can also be extended and retracted correspondingly. The case 200 forming an exterior of the roll-slide mobile terminal 100 includes a first frame 210 and a second frame 220. The second frame 220 can slidably move with respect to the first frame 210. A direction in which the second frame 220 move with respect to the first frame 210 is defined as a first direction. Since the first frame 210 and the second frame 220 move relatively, a stationary member and a slidably moving member can also be described vice versa. As the display 151 wound over a front surface and a rear surface of the case 200, the front surface area 151F is increased or decreased in size based on a sliding movement of the second frame 220.

In the embodiment, it is assumed that the first frame 210 forms a main exterior area and the second frame 220 is withdrawn from the first frame 210. Thus, a main electronic component area can be located in the first frame 210. And it is also assumed that the display 151 is fixed with first frame 210 at one end portion in the first direction and the winding area 151C is formed at the other end portion in a direction opposite to the first direction.

Under this embodiment, as the second frame 220 moves in the first direction (this corresponds to the expansion of the roll-slide mobile terminal 100), the front surface area 151F increases, and the winding area 151C moves in the direction opposite to the first direction in the area of the display 151. On the other hand, as the second frame 220 moves in the direction opposite to the first direction (this corresponds to the retraction of the roll-slide mobile terminal 100), the front surface area 151F reduces, and the winding area 151C moves in the first direction in the area of the display 151.

In practice, the display 151 may not be exposed externally at one of the front surface and the rear surface, but preferably, at least one surface is provided to be viewable outside.

The winding area of the display part may can also be changed according to a sliding movement of the second frame. In the front surface area 151F of the display 151, an area constantly maintained irrespective of expansion and retraction is referred to as a fixed area 151U, and an area selectively exposed on the front surface based on the expansion and the reduction is referred to as a variable area 151X. Also, an area between the rear surface area 151R of the display 151 and the front surface area 151F of the display 151 is referred to as the winding area 151C. Depending on cases, the variable area 151X may be included in the front surface area 151F and also be included in the rear surface area 151R.

In addition, the fixed area 151U of the front surface area 151F of the display 151 can be fixedly located in the first frame 210 and also be fixedly located in the second frame 220. In the embodiment, it is assumed that the fixed area 151U is fixedly located in the second frame 220. For example, as illustrated in FIGS. 2A and 2B, when the second frame 220 slides in the first direction, the fixed area 151U of the display 151 fixed to the second frame 220 moves accordingly. However, as described above, this is not limitative and vice versa.

When the second frame 220 slides in the first direction and extends from the first frame 210, the front surface area 151F of the display 151 can be increased such that the fixed area 151U and the variable area 151X are exposed on the front surface. When the second frame 220 slides in a direction opposite to the first direction and is retracted toward the first frame 210, the front surface area 151F of the display 151 can also be reduced such that only the fixed area 151U remains.

In addition, the rear surface area 151R of the display 151 can be exposed on a rear surface of the second frame 220. The rear surface area 151R can also be covered by a light-transmitting rear window to be viewable externally. However, the rear surface area 151R can also be implemented not to be viewable externally.

Also, a rear cover can function to shield and protect a movable structure in which the display 151 moves on the rear surface of the second frame 220. The front surface area 151F can also be exposed on the front surface without using a separate window. Further, a deco frame can cover a boundary area of the front surface area 151F and the first frame 210 to prevent an inflow of foreign material and cover a bezel area of the roll-slide mobile terminal 100 so as to provide a user with enhanced screen visibility.

In addition, an electronic component area can be formed in an inner space formed by an external structure such as the first frame 210 and the second frame 220. For example, electronic components such as a battery for driving the roll-slide mobile terminal 100 can be mounted on a main-printed circuit board (PCB) so as to be included in the electronic component area. An electronic component such as an inner antenna module may also be provided directly in the electronic component area, not through the main-PCB.

Figure 4A:
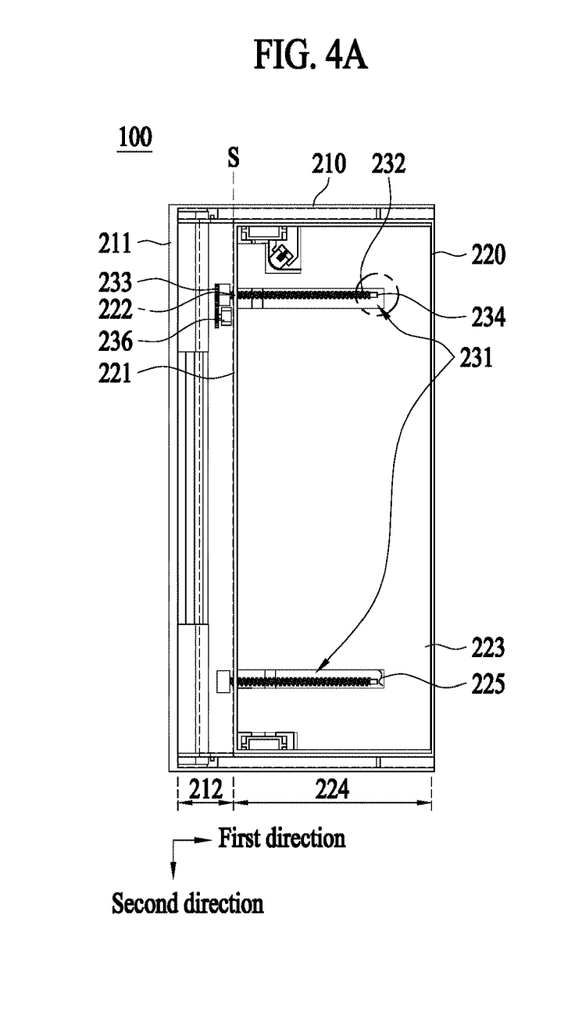
FIGS. 4A and 4B illustrate front views of an inside of a roll-slide mobile terminal before and after an expansion according to the present disclosure.
Figure 4B:
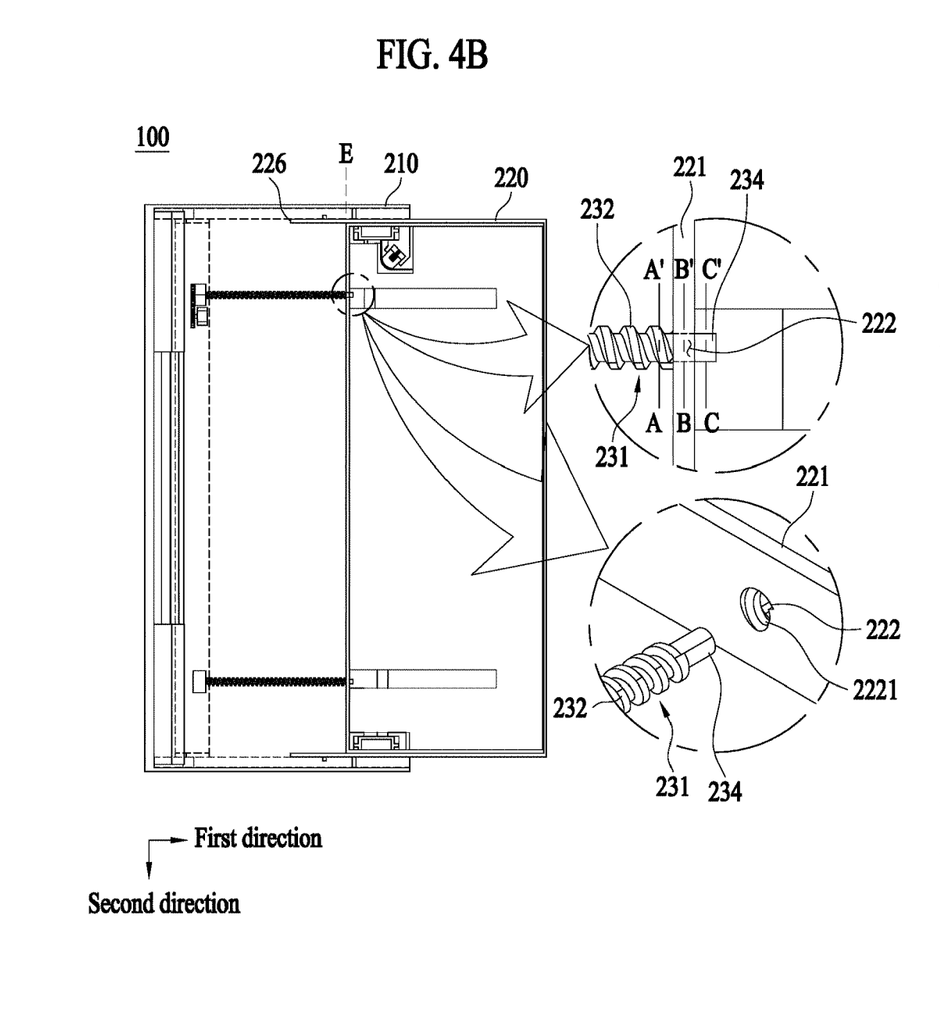
Figure 5A:
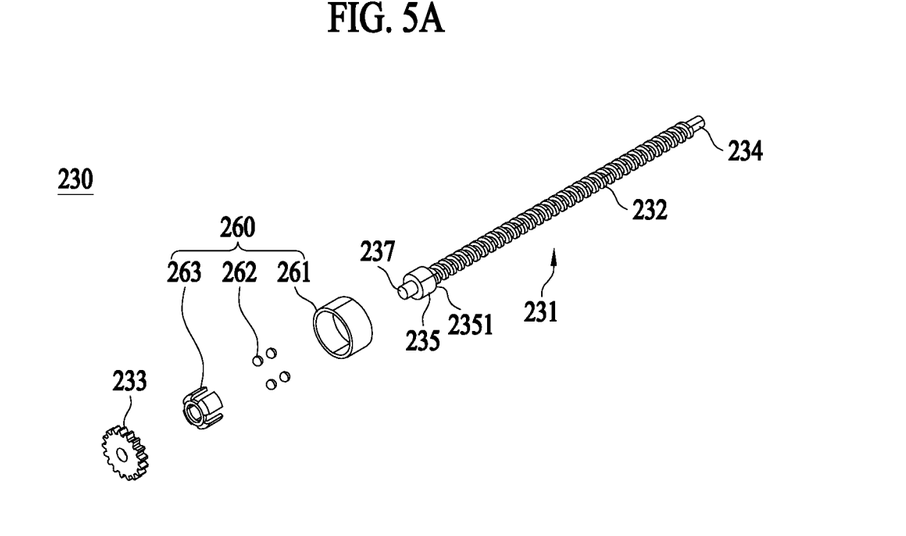
FIGS. 5A and 5B illustrate perspective views obtained before and after some components of a slide assembly are combined.
Figure 5B:
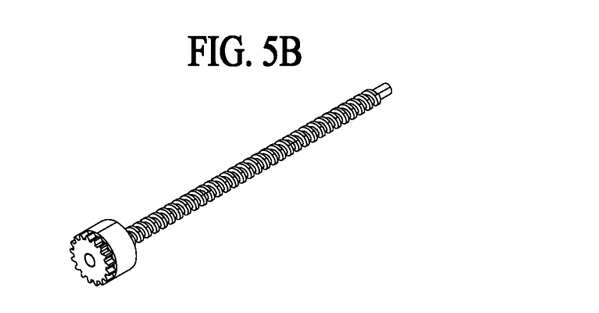
Figure 6A:
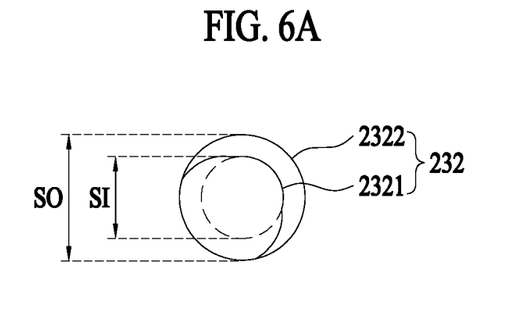
FIGS. 6A through 6C illustrate cross-sectional views taken along lines A-A', B-B', and C-C' of FIG. 4B.
Figure 6B:
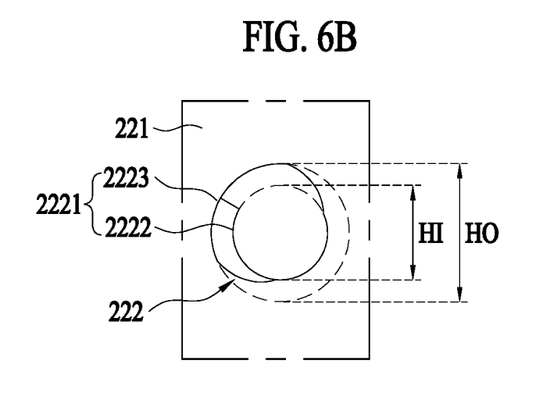
Figure 6C:
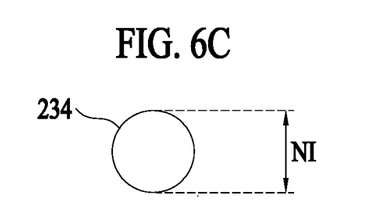

Next, FIGS. 4A and 4B illustrate front views of an inside of the roll-slide mobile terminal 100 before and after an expansion, FIGS. 5A and 5B illustrates perspective views obtained before and after some components of a slide assembly 230 are combined, and FIGS. 6A, 6B and 6C illustrates cross-sectional views taken along lines A-A', B-B', and C-C' of FIG. 4B.

A sliding movement of the second frame 220 relative to the first frame 210 can be driven by a driving part. The driving part includes, for example, a motor and a gear. In addition, there are various ways to slide the second frame 220 using a structure of the motor and the gear including a scheme using a linear gear may be used. In this scheme, the motor can be provided at one side of the first frame 210 and the second frame 220 and the linear gear is provided at the other side of the first frame 210 and the second frame 220, so that a rotation of the motor is directly applied to the linear gear for movement. Such type of structure has an advantage that its implementation is relatively simple. However, because the motor directly transmits torque, a load on the motor is relatively large and a large stress may be generated between the motor and the linear gear.

Accordingly, the present disclosure provides a structure for minimizing such load and preventing an overload. In the present disclosure, a structure of a rotary shaft 231 that replaces a linear shaft is used to minimize the load on the motor or the gear. More specifically, a driving mechanism can be implemented by the shaft and a frame, for example, the second frame 220. The shaft 231 includes a helical screw line 232 forming a rotation axis in a first direction in which the frame slides. Thus, the frame can slide along the screw line 232 according to a rotation of the shaft 231. The frame can also have a screw hole 222 through which the shaft 231 passes and have a screw line 2221 of the screw hole 222 corresponding to the screw line 232 of the shaft 231.

When the shaft 231 is included in the first frame 210, the screw hole 222 can be formed in the second frame 220. When the shaft 231 is included in the second frame 220, the screw hole 222 can be formed in the first frame 210. The following description describes the shaft 231 is included in the first frame 210 and the screw hole 222 is included in the second frame 220.

As shown, the shaft 231 includes a gear 233 to be rotatably engaged with a motor 236. The gear 233 is also referred to as the shaft gear 233. In addition, the shaft gear 233 is fixed to the shaft 231, so that the shaft 231 rotates in response to the motor 236 rotating the shaft gear 233. In this instance, the screw line 232 of the shaft 231 can also rotate.

In some instances, at least one gear can be additionally disposed between the motor 236 and the shaft gear 233. In particular, the at least one gear can serve to connect separated spaces or adjust a torque or a rotation speed by adjusting a gear ratio.

When the shaft 231 rotates, the screw line 232 engages with the second frame 220 to move the second frame 220 in the first direction or a direction opposite to the first direction. In this example, the motor 236 can move the second frame 220 by transmitting a driving force through the shaft 231 instead of moving directly. Thus, a load directly applied to the motor 236 can be reduced. Also, a concentration of stress can be reduced as a force is distributed over numerous areas, for example, between the motor and the gear and between the shaft 231 and the frame.

Components used to implement the sliding movement of the second frame 220 are defined as the slide assembly 230. In particular, the slide assembly 230 includes not only the motor 236, the shaft 231, and the shaft gear 233, but also gears to be added and a bearing structure 260 described below.

When the shaft 231 rotates in one direction, the second frame 220 having the screw hole 222 in which the shaft 231 is fit can slidably move in the first direction, which can lead to an expansion of the roll-slide mobile terminal 100. Conversely, when the shaft 231 rotates in the other direction, the second frame 220 having the screw hole 222 in which the shaft 231 is fit can slidably move in the direction opposite to the first direction, which may lead to a retraction of the roll-slide mobile terminal 100.

In addition, the motor 236 and the shaft gear 233 that receives a rotational force of the motor 236 can be located in a space on a side of an end portion of the shaft 231 in the direction opposite to the first direction. For example, the space can correspond to an electronic component area 212 included in the first frame 210.

Preferably, the electronic component area 212 of the first frame 210 is disposed not to interfere with an area in which the second frame 220 moves. Also, the second frame 220 can additionally include an electronic component area 224.

The screw hole 222 can be formed in a first side wall 221 that forms a boundary of an end portion of the second frame 220 in the direction opposite to the first direction. Also, a boundary of an end portion of the first frame 210 in the direction opposite to the first direction can be defined by a second side wall 211. Further, the electronic component area 212 of the first frame 210 can be formed in a space between the first side wall 221 and the second side wall 211 before an expansion. That is, the electronic component area can be provided not to interfere with other components in a process of moving the first side wall 221.

Also, as described above, the electronic component area 224 can be implemented inside the second frame 220. For this, a middle frame 223 can be provided in the second frame 220 to form the electronic component area 224. The middle frame 223 can include a rigid material such as polycarbonate or metal and can block at least one area of an inner space of the second frame 220, thereby forming the electronic component area 224. The middle frame 223 can also be implemented in a form of a circuit board such that electronic components are mounted directly on the circuit board. Further, the middle frame 223 can include an open area 225 corresponding to the shaft 231.

The shaft 231 can be located near a center of a thickness direction of the second frame 220. Thus, when the middle frame 223 is implemented to cover the shaft 231, a large space loss in the thickness direction can be caused. To prevent this, the shaft 231 can be located in the open area 225 of the middle frame 223 so as to increase a degree of freedom in arranging the middle frame 233 with respect to the thickness direction.

In addition, the screw line 232 of the shaft 231 can be formed from a point S to a point E. In particular, the point S can be a point at which the screw hole 222 is located when the second frame 220 is fully extended, and the point E can be a point at which the screw hole 222 is located when the second frame 220 is fully retracted. Through this, the shaft 231 can be prevented from excessively increasing in length. In other words, the screw line 232 can be formed to guide in the first direction until the second frame 220 is fully extended. Also, the screw line 232 can be formed to guide in the direction opposite to the first direction until the second frame 220 is fully retracted.

In addition, a support protrusion 235 can be provided at the end portion in the direction opposite to the first direction to prevent further movement of the first side wall 221. In particular, the support protrusion 235 can have a diameter greater than a maximum diameter of the screw hole 222. Even if the motor rotates further due to the provision of the support protrusion 235, the screw hole 222 can contact a support plane 2351 of the support protrusion 235, thereby preventing the second frame 220 from moving farther from a predetermined point in the direction opposite to the first direction.

Also, a support end portion 226 of the second frame 220 can support by the first frame 210. The first frame 210 can include the bearing structure 260 that prevents from moving excepting rotation of the shaft 231. The bearing structure 260 can stably fix the shaft 231, minimize noise during operation by minimizing, for example, a friction occurring therein, reduce power consumption for rotating the shaft 231, and minimize a load transmitted to the motor 236.

The bearing structure 260 includes a support ring 261 and a bearing ball 262. The support ring 261 can be supported and fixed to the first frame 210 and cover a circumference of at least one area of the shaft 231. The one area can be a side close to the shaft gear 233. For example, the support ring 261 can be provided to cover a circumference of a side surface of the support protrusion 235. Further, the side surface of the support protrusion 235 can be implemented as a cylindrical side surface. A plurality of bearing balls 262 can be disposed between the support ring 261 and the shaft 231. A number of the bearing balls 262 can vary based on, for example, a required friction.

In addition, a movement preventing bracket 263 can be disposed between the bearing balls 262 to circumferentially support the bearing balls 262. For example, when four bearing balls 262 are provided, the movement preventing bracket 263 having four slits to fill gaps between the bearing balls 262 can be provided.

An end portion of the support protrusion 235 in the direction opposite to the first direction can have a coupling protrusion 237 to which the shaft gear 233 is coupled. The coupling protrusion 237 can be formed to correspond to an inner circumferential surface of the shaft gear 233 to transmit a rotation of the shaft gear 233 to the shaft 231. The inner circumferential surface of the shaft gear 233 can be provided in a circular shape. Also, an angular shape can be included in the one area to prevent an idling rotation between the shaft gear 233 and the coupling protrusion 237.

The support protrusion 235 can be provided in both end portions of the screw line 232. In this instance, however, the second frame 220 can be forcibly prevented from moving, which can cause a load on the motor 236. Thus, a structure for preventing extension or retraction of the second frame 220 in another way without having such disadvantage can be formed.

For example, a structure that passes the screw hole 222 of the second frame 220 and is not restrained by the screw line 2221 of the screw hole 222 can be formed following the screw line 232. The above structure of the shaft 231 is referred to as an extension preventing part 234. The extension preventing part 234 can be located in an end portion of the shaft 231 in the first direction. In particular, the second frame 220 can be prevented from moving beyond a predetermined range in the first direction because an excessive extension causes damage on the display 151 expanded based on the moving of the second frame 220.

The extension preventing part 234 can be formed after a point of the screw line 232 of the shaft 231 corresponding to a maximum extension point of the second frame 220 and can have a size not to be engaged with the screw line 2221 of the screw hole 222. More specifically, the extension preventing part 234 can have a cylindrical shape with a diameter NI smaller than a diameter HI of a screw thread 2222 of the screw hole 222, that is, a minimum diameter of the screw line 2221 of the screw hole 222. The screw hole 222 can be prevented from moving farther in the first direction by the extension preventing part 234. In addition, when the shaft 231 ends without having the extension preventing part 234, the screw hole 222 can completely deviate from the shaft 231 and unable to move in the direction opposite to the first direction.

Figure 7:
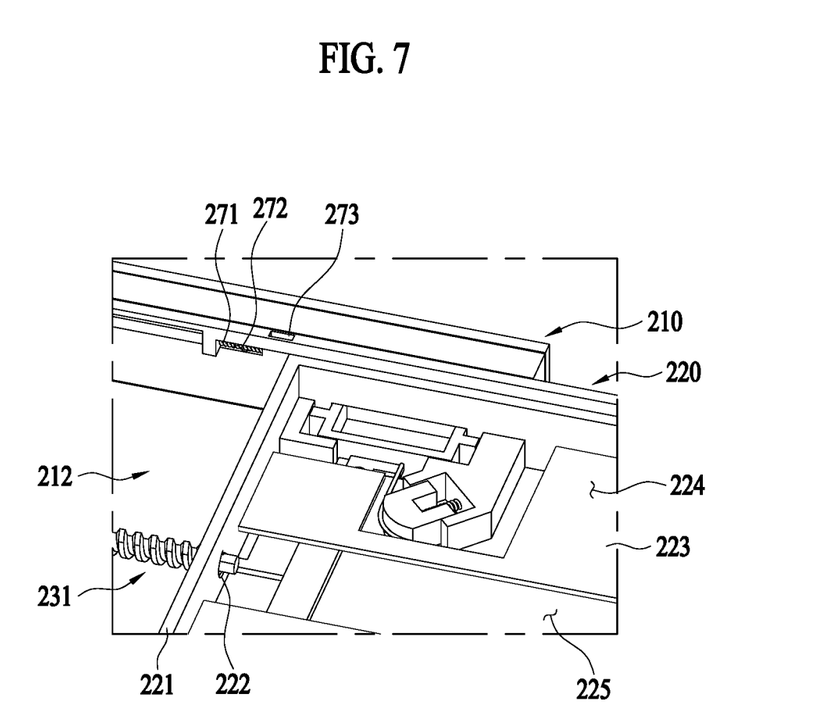
FIG. 7 illustrates an area inside a roll-slide mobile terminal according to the present disclosure.

Next, FIG. 7 illustrates one area inside the roll-slide mobile terminal 100 according to the present disclosure. Even if the screw hole 222 is in connection with the shaft 231, once deviated from the screw line 232, the screw hole 222 is unable to move in the direction opposite to the first direction. To prevent this, a spring 271 can be provided to apply a force to the second frame 220 in the direction opposite to the first direction. The force applied to the second frame 220 by a restoring force of the spring 271 can be a force attracting the second frame 220 from an inside or a force pushing the second frame 220 from an outside.

One end of the spring 271 can be supported by one of the first frame 210 and the second frame 220. The other end of the spring 271 can be supported at a point at which the extension of the second frame 220 is completed or a point before a predetermined distance based on the point at which the extension of the second frame 220 is completed. Through this, the screw hole 222 can remain without completely deviating from the screw line 232 of the shaft 231. When the second frame 220 is fully extended, the spring 271 is maximally compressed. The spring 271 can also have one side fixedly supported by the first frame 210 or the second frame 220.

Figure 8A:
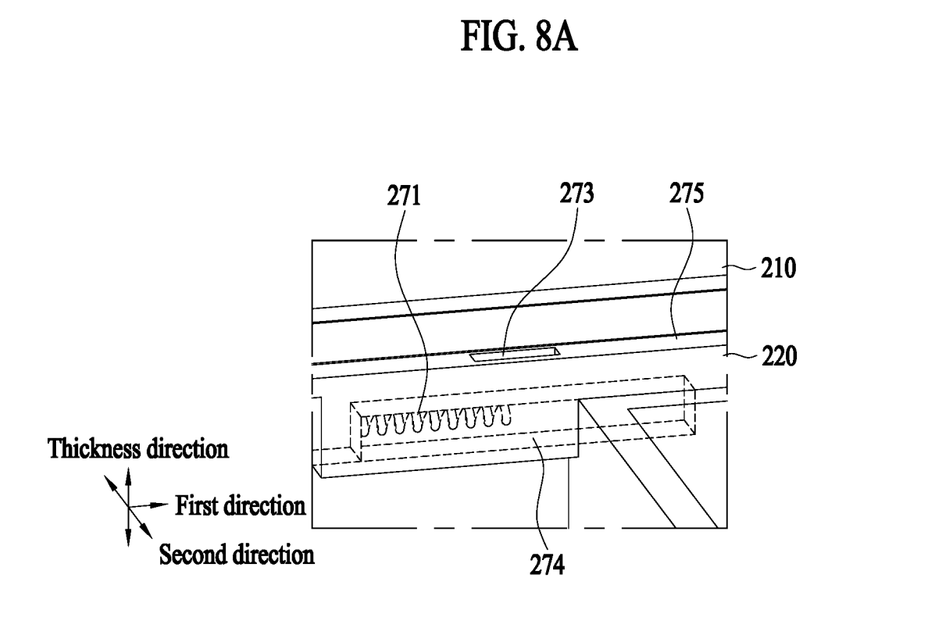
FIGS. 8A and 8B illustrate a seating portion before and after an extension of a second frame according to the present disclosure.
Figure 8B:
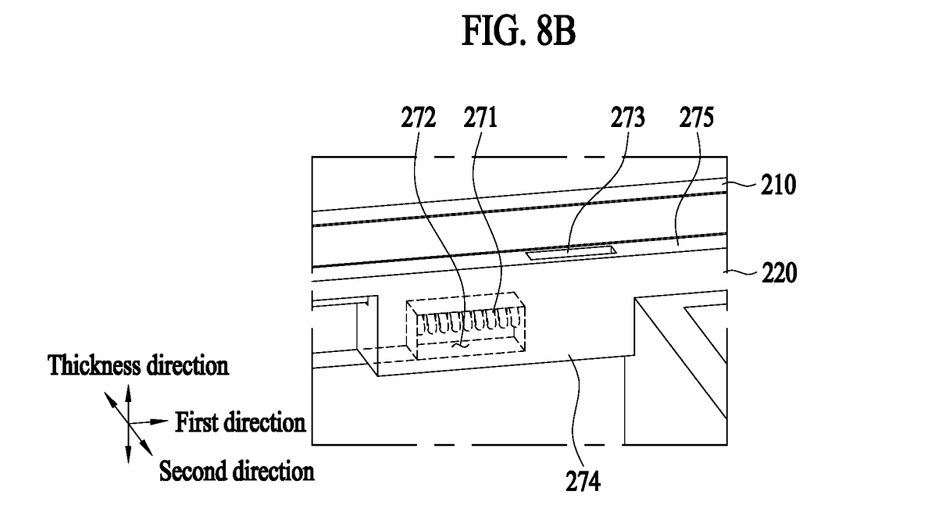

Next, FIGS. 8A and 8B illustrates a seating part 272 before and after an extension of the second frame 220 according to the present disclosure. For ease of description, FIG. 7 is referenced together. In another embodiment, the spring 271 can be mounted in the seating part 272 formed by the first frame 210 and the second frame 220. In particular, the seating part 272 can form a closed space to prevent an escape of the spring 271. Here, the closed space is a space that is closed enough to prevent the spring 271 from escaping rather than a physically enclosed space.

The seating part 272 can form a space to be expanded or contracted in the first direction based on a movement of the second frame 220. The seating part 272 can also have a cuboid shape. A second direction outer surface, a first surface end portion surface, and a thickness direction lower surface of the seating part 272 can be formed by the first frame 210. A second direction inner surface 274, a first direction opposite direction end portion surface, and a thickness direction upper surface 275 can be formed by the second frame 220. Thus, a distance between the first surface end portion surface and the first direction opposite direction end portion surface can increase or decrease based on the extension or retraction of the second frame 220.

Simultaneously, the seating part 272 can include an insertion hole 273 into which the spring 271 is inserted at a time of initial assembly. The insertion hole 273 can be formed in the second direction inner surface 274 or the thickness direction upper surface 275 of the second frame 220. When the second frame 220 is fully retracted, the insertion hole 273 can open the seating part 272. When the second frame 220 is fully extended, the insertion hole 273 can be out of the seating part 272. That is, the insertion hole 273 can be formed close to the first direction end portion. When the second frame 220 extends, the insertion hole 273 is pushed in the first direction to be out of a range of the seating part 272, so that the spring 271 may not escape therefrom.

Desirably, the insertion hole 273 may be smaller in length than the spring 271 in a released state such that the spring 271 may not escape once inserted therein. In this instance, the spring 271 can be compressed in a predetermined length for insertion.

Referring back to FIGS. 4A and 4B, the slide assembly 230 can be provided in plural in a second direction vertical to the first direction and parallel to a front surface area of the roll-slide mobile terminal 100. To achieve space efficiency, the slide assemblies 230 can be provided on both sides in the second direction. Considering that a second directional length is relatively large, it is desirable to provide the slide assemblies 230 on both sides to balance a force.

In some instances, the motor 236 can be provided on one of the slide assemblies 230 on both sides. In such instances, the slide assembly 230 on a side without the motor can solve a problem that the second frame 220 does not move accurately in the first direction and is twisted and caught during the sliding movement.

Further, the shaft 231 of the slide assembly 230 on a side without the motor can engage using a screw line. Also, the shaft 231 and the screw hole 222 can be provided without the screw line to minimize an energy loss due to the friction.

Thus, the embodiments of the present disclosure are particularly advantageous because it is possible to provide a roll-slide mobile terminal having a motor with less load. Further, a load applied to a motor and a gear can be reduced, and the roll-slide mobile terminal can be prevented from extending or retracting beyond a predetermined range.

Further, it is possible to retract a roll-slide mobile terminal without difficulty while preventing the roll-slide mobile terminal from extending beyond a predetermined range. It is also possible to stably extend a roll-slide mobile terminal using less power.

Additional ranges of possibilities will become apparent from the following detailed description. It should be understood, however, that the detailed description and specific examples, such as the preferred embodiments of the present disclosure, are given by way of illustration only, since various changes and modifications within the spirit and scope of the present disclosure will be apparent to those skilled in the art.

What is claimed is:

1. A roll-slide mobile terminal comprising:
a case including a first frame and a second frame configured to slide and extend in a first direction with respect to the first frame;
a flexible display wound over a front surface and a rear surface of the case, wherein an area of the front surface of the flexible display is increased or decreased in size based on a sliding movement of the second frame;
a slide assembly provided in one member of the first frame and the second frame and including a shaft having a rotation axis in the first direction and forming a screw line along the rotation axis;
a motor rotating the shaft; and
a screw hole provided in the other member of the first frame and the second frame, the screw hole configured to engage the screw line of the shaft passing through the screw hole,
wherein the second frame slidably moves with respect to the first frame according to a rotation of the shaft.

2. The roll-slide mobile terminal of claim 1, wherein the slide assembly comprises:
a support ring fixed to the one member and covering a circumference of an area of the shaft; and
a plurality of bearing balls provided between the support ring and the shaft.

3. The roll-slide mobile terminal of claim 2, further comprising:
a movement preventing bracket configured to circumferentially support the plurality of bearing balls.

4. The roll-slide mobile terminal of claim 2, wherein the slide assembly further comprises:
a motor; and
at least one shaft gear configured to transmit a rotation of the motor to the shaft,
wherein the support ring is located on a side of the shaft near the at least one shaft gear.

5. The roll-slide mobile terminal of claim 2, wherein the one member is the first frame and the other member is the second frame,
wherein the second frame further comprises:
a first side wall forming a boundary of an end portion of the second frame in a direction opposite to the first direction, and
wherein the screw hole is formed in the first side wall and when the second frame is fully retracted, the screw hole is located at an end portion of the screw line of the shaft in the direction opposite to the first direction.

6. The roll-slide mobile terminal of claim 5, wherein the slide assembly further comprises a support protrusion provided connectedly at an end portion of the screw line in the first direction to form a support plane to support the screw hole.

7. The roll-slide mobile terminal of claim 6, wherein a circumference of the area of the shaft covered by the support ring is a side surface circumference of the support protrusion.

8. The roll-slide mobile terminal of claim 1, wherein the one member is the first frame and the other member is the second frame,
wherein the second frame further comprises:
a first side wall forming a boundary of an end portion of the second frame in a direction opposite to the first direction,
wherein the first frame further comprises:
a second side wall forming a boundary of an end portion of the first frame in the direction opposite to the first direction,
wherein the roll-slide mobile terminal further comprises:
an electronic component area formed between the first side wall and the second side wall, and
wherein the slide assembly except the shaft is provided in the electronic component area.

9. The roll-slide mobile terminal of claim 1, wherein the slide assembly includes a pair of slide assemblies on both sides of the roll-slide mobile terminal in a second direction vertical to the first direction and parallel to an area of the front surface of the case.

10. The roll-slide mobile terminal of claim 1, wherein the shaft further comprises:
an extension preventing part provided at an end portion in an extending direction and having a size not engaging with a screw line of the screw hole.

11. The roll-slide mobile terminal of claim 10, wherein the extension preventing part is smaller in diameter than a thread of the shaft.

12. The roll-slide mobile terminal of claim 10, further comprising:
a restoring member configured to apply a force in a direction opposite to the first direction to the second frame when the second frame is fully extended, such that the screw hole is located at one end of the screw line of the shaft.

13. The roll-slide mobile terminal of claim 12, wherein the restoring member comprises a spring supporting the first frame, and being compressed at a preset distance before the second frame is fully extended, and being maximally compressed when the second frame is fully extended.

14. The roll-slide mobile terminal of claim 12, wherein the restoring member is located in a closed space formed by the first frame and the second frame in the first direction as a longitudinal direction.

15. The roll-slide mobile terminal of claim 1, wherein the one member is the first frame and the other member is the second frame, and
wherein the second frame further comprises:
a middle frame of which an area corresponding to the shaft forms an opening.

16. The roll-slide mobile terminal of claim 1, wherein a portion of the flexible display on the rear surface of the case is wound onto the front surface of the case when the second frame is slid and extended from the first frame such the area of the front surface of the flexible display is increased in size, and
wherein the portion of the flexible display wound onto the front surface of the case is wound onto the rear surface of the case when the second frame is slid and retracted from the first frame such the area of the front surface of the flexible display is decreased in size.

17. The roll-slide mobile terminal of claim 1, wherein the flexibly display covers the front surface and the rear surface of the case when the second frame is fully retracted with respect to the first frame.

18. The roll-slide mobile terminal of claim 1, wherein the flexible display has one side fixed at the front surface of the case and winding area at an edge of one end of the case so as to be provided over the rear surface and divide the flexible display into a front surface area of the flexible display and a rear surface area of the flexible display,
wherein the winding area is variable in location based on a sliding movement of the second frame, and wherein the front surface area of the flexible display is expandable such that as the front surface area increases, the rear surface area of the flexible display is reduced, and when the front surface area of the flexible display is reduced, the rear surface area of the flexible display increases.

19. The roll-slide mobile terminal of claim 1, wherein the slide assembly includes:
a first shaft having a rotation axis in the first direction and forming a first screw line along the rotation axis; and
a second shaft parallel to the first shaft and having the rotation axis in the first direction and forming a second screw line along the rotation axis, and
wherein the first and second shafts rotate in unison to slidably move the second frame with respect to the first frame.

20. The roll-slide mobile terminal of claim 1, wherein the screw line of the shaft is formed from a point at which the screw hole is located when the second frame is fully extended, and a point at which the screw hole is located when the second frame is fully retracted.

* * * * *